(12) United States Patent
Okabayashi

(10) Patent No.: US 7,620,869 B2
(45) Date of Patent: Nov. 17, 2009

(54) SEMICONDUCTOR INTEGRATED CIRCUIT AND BIST CIRCUIT DESIGN METHOD

(75) Inventor: Kazuhiro Okabayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 304 days.

(21) Appl. No.: 11/730,423

(22) Filed: Apr. 2, 2007

(65) Prior Publication Data

US 2008/0040640 A1 Feb. 14, 2008

(30) Foreign Application Priority Data

Apr. 25, 2006 (JP) ............................ 2006-120964

(51) Int. Cl.
*G01R 31/28* (2006.01)
(52) U.S. Cl. .................................... 714/736
(58) Field of Classification Search .............. 714/731, 714/744, 736
See application file for complete search history.

(56) References Cited

U.S. PATENT DOCUMENTS

| | | | | |
|---|---|---|---|---|
| 5,260,949 A | * | 11/1993 | Hashizume et al. | ......... 714/731 |
| 5,926,397 A | * | 7/1999 | Yamanouchi | ................. 716/14 |
| 6,606,736 B1 | * | 8/2003 | Kobayashi et al. | ............ 716/10 |
| 6,678,846 B1 | * | 1/2004 | Maeno | ........................ 714/726 |
| 7,114,140 B2 | * | 9/2006 | Ishikura | .......................... 716/8 |
| 7,290,183 B2 | * | 10/2007 | Shimamura | ................. 714/700 |
| 7,367,005 B2 | * | 4/2008 | Kosugi et al. | .................. 716/10 |
| 2003/0005397 A1 | * | 1/2003 | Larsen | ........................... 716/6 |

FOREIGN PATENT DOCUMENTS

JP    2000-111618    4/2000

* cited by examiner

Primary Examiner—James C Kerveros
(74) Attorney, Agent, or Firm—McDermott Will & Emery LLP

(57) ABSTRACT

A semiconductor integrated circuit comprising a plurality of memory circuits; a BSIT circuit 140 operable to output test vectors; and one or more register circuit(s) 150 each allocated on a signal line that transmits test vectors output by the BIST circuit 140 to any of the memory circuits, and operable to sequentially transfer the test vectors to an adjoining macro cell in accordance with the clock signals.

4 Claims, 9 Drawing Sheets

SEMICONDUCTOR INTEGRATED CIRCUIT AND BIST CIRCUIT DESIGN METHOD

BACKGROUND OF THE INVENTION (1) Field of the Invention

The present invention relates to a BIST (Built-in Self Test) for a semiconductor integrated circuit, and particularly to a technique to test an SRAM at high speed by the BIST.

(2) Description of the Related Art

In recent years, a high-integration technique, such as a SoC by which a plurality of processors, a programmable logic circuit, dedicated hardware, a plurality of memories and so on are mounted, has been put into practical use. Due to such high integration, the number of external input/output terminals is comparatively small for its circuit size, and it is difficult to conduct a sufficient test for the semiconductor integrated circuit from outside. Therefore, to test the quality of memory circuits incorporated in the semiconductor integrated circuit, a BIST which uses only the circuits incorporated in the semiconductor integrated circuit is often applied.

However, it is necessary for the BIST to provide a circuit block only for the test, and this causes an area overhead on the circuit.

To reduce such an area overhead, Japanese Laid-open Patent Application Publication No. 2000-111618 (Document 1) discloses a technique to share a BIST circuit that generates a test vector, to test a plurality of SRAMs.

However, with the structure disclosed by the Document 1, since the BIST circuit provides a plurality of SRAMs with a test vector, the length of a wire led to an SRAM placed away from the BIST circuit is long, and an interconnect delay becomes large.

If the interconnect delay is relatively large with respect to the operation speed of the SRAM, the BIST circuit is required to provide a test vector in accordance with the SRAM whose interconnect delay is large. Therefore, the test speed is limited to the interconnect delay speed, and it is impossible to conduct a test at an original speed of the memory circuit, that is, so called an at-speed test. This is a problem.

SUMMARY OF THE INVENTION

In view of the problem above, one of the objects of the present invention is to provide a semiconductor integrated circuit that is capable of improving the test speed while reducing the area overhead of the BIST circuit. Another one of the objects of the present invention is to provide a BIST circuit design method for designing a circuit capable of improving the test speed while reducing the area over head of the BIST circuit.

To fulfill the above objects, the present invention provides a semiconductor integrated circuit comprising: a testing circuit operable to sequentially output test vectors in accordance with clock signals; a plurality of memory circuits; and one or more register circuits each allocated on a signal line connecting the testing circuit with any of the memory circuits, and operable to receive test vectors output by the testing circuit, and transfer the received test vectors in accordance with the clock signals.

The present invention is achieved based on an idea that the speed in providing the test vectors is determined by the interconnect delay occurring between the testing circuit and the memory circuit, and that if the interconnect delay between the testing circuit and the memory circuit is larger than the operation speed of the memory circuit, the apparent interconnect delay can be reduced by allocating a register circuit on the wiring so as to form a pipeline.

The semiconductor integrated circuit according to the present invention with the stated structure is capable of reducing the area overhead by sharing the testing circuit among the plurality of memory circuits, while providing the test vectors in accordance with the interconnect delay time between the testing circuit and the register circuit or the register circuit and the memory circuit, not with the interconnect delay time between the testing circuit and the memory circuit. This improves the test speed of the BIST.

Here, an interconnect delay that occurs between any adjoining two of the test circuit, the memory circuits and the one or more register circuits may be equal to or shorter than an access time required for each of the memory circuits to write and read data.

With the stated structure, the speed of the testing circuit in generating the test vector can be accelerated to be equivalent to the access speed of the memory circuit.

Accordingly, an at-speed test for performing a memory BIST at the access speed of the memory circuit becomes available.

Here, the register circuits may be allocated on the signal line in series, thereby constituting a shift register, the shift register may output in parallel the test vectors input in series, and each memory circuit may receive the test vectors from any of the register circuits that constitute the shift register.

With the stated structure, it is possible to provide the plurality of memory circuits with the test vectors via the shared signal line.

Accordingly, the semiconductor integrated circuit according to the present invention can further reduce the area overhead required for the memory BIST.

Here, the semiconductor integrated circuit may further comprise: a comparison shift register including a plurality of register circuits and operable to output in parallel a plurality of pieces of comparison data input in series; and a plurality of comparison circuits respectively corresponding to the memory circuits, each operable to compare read data with compare data, the read data having been read by corresponding one of the memory circuits in accordance with the test vectors, and the comparison data having been output from any of the register circuits that constitute the comparison shift register, wherein the testing circuit sequentially outputs pieces of comparison data respectively corresponding to the test vectors to the comparison shift register in accordance with the clock signals.

With the stated structure, the comparison data can also be provided using the signal line shared by the comparison circuits corresponding to the plurality of the memory circuits.

Accordingly, the semiconductor integrated circuit according to the present invention can further reduce the area overhead required for the memory BIST.

Here, the semiconductor integrated circuit may further comprise: another one or more register circuits each allocated on a signal line connecting the testing circuit with any of the comparison circuits, and operable to receive a comparison result output by the any of the comparison circuits, and transfer the received comparison result to an adjoining macro cell in accordance with the clock signals.

With the stated structure, also regarding the signal line connecting the testing circuit to the comparison circuit, it is possible to reduce the apparent interconnect delay and share the testing block among the plurality of memory circuits by allocating the register circuits so as to form a pipeline. Accordingly, it is possible to further reduce the area overhead.

To fulfill the above objects, the present invention also provides a method for designing a BIST circuit, comprising the steps of: calculating an interconnect delay time that occurs between macro cells allocated on a signal line from a testing circuit to a memory circuit, the testing circuit sequentially outputting test vectors in accordance with clock signals; judging whether the interconnect delay time is longer than a testing time required for the memory circuit to write and read data indicated by each test vector; and if the interconnect delay time is longer than the testing time, changing a design of the BIST circuit so as to add, on the signal line, a register circuit that transfers the test vectors in accordance with the clock signals.

The method for designing a BIST circuit according to the present invention with the stated structure is capable of inserting the register circuit if the interconnect delay time between the macro cells on the signal line connecting the testing circuit and the memory circuits is longer than the testing time of the memory circuits. Accordingly, it is possible to design a circuit that is capable of improving the test speed of the BIST by providing the test vectors in accordance with the interconnect delay time that occurs between the testing circuit and the register circuit or the register circuit and the memory circuit.

BRIEF DESCRIPTION OF THE DRAWINGS

These and the other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENTS

The following describes the preferred embodiments of the present invention, with reference to drawings.

First Embodiment

Figure 1:
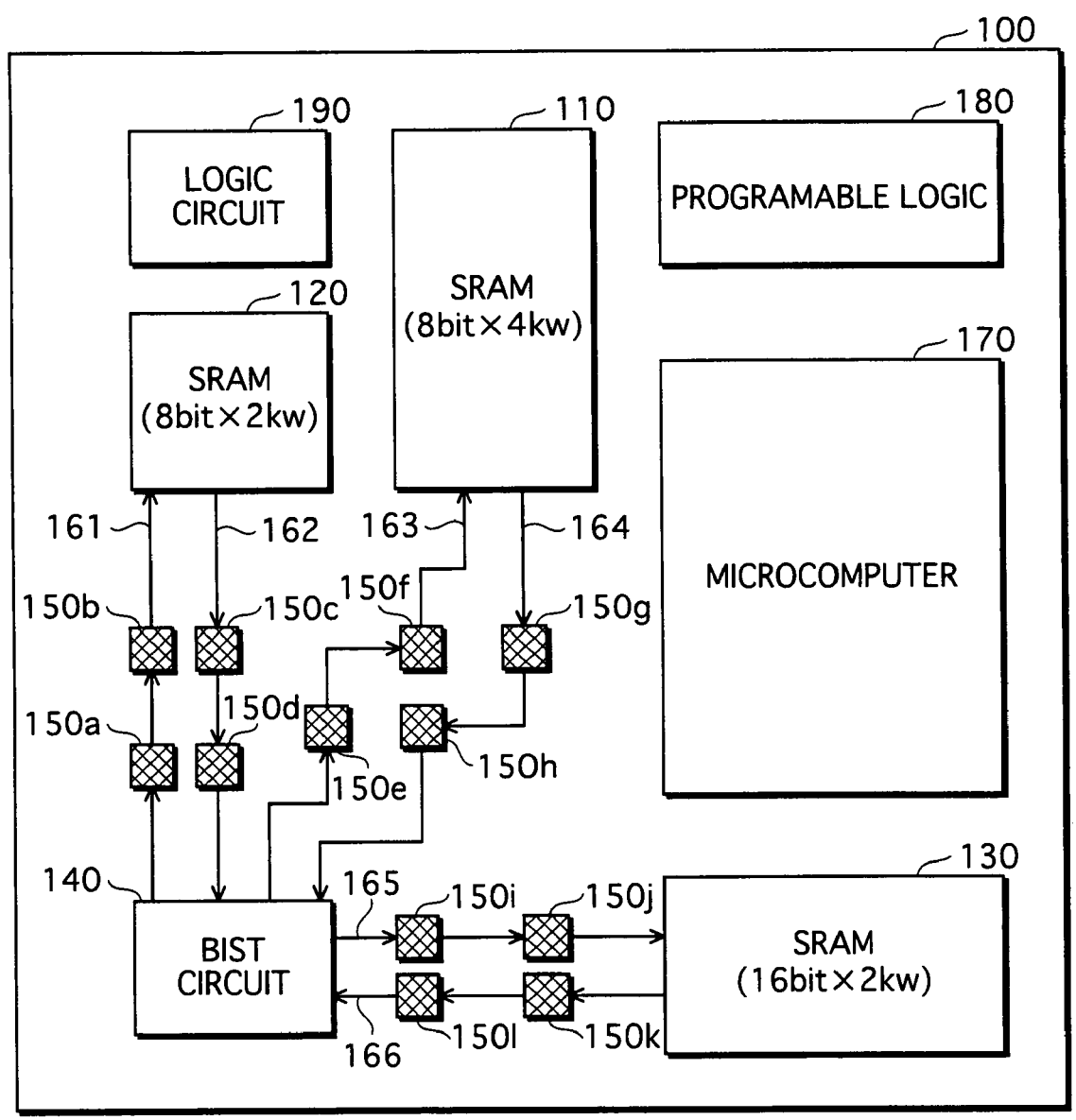
FIG. 1 schematically shows a layout of an LSI 100 according to the first embodiment.

FIG. 1 shows a layout of an LSI 100 according to the present invention.

The LSI 100 is a system LSI that includes circuit blocks formed on a semiconductor substrate, namely memories 110, 120 and 130, a BIST circuit 140, registers 150a-150l, a microcomputer 170, a programmable logic circuit 180 and a logic circuit 190. Note that the LSI 100 may include other circuits in addition to the circuits mentioned above.

The memory BIST, which is the subject matter of the present invention, is performed on the memories 110, 120 and 130. The memory 110 is an 8-bit×4K-word memory circuit. The memory 120 is an 8-bit×2K-word memory circuit. The memory 130 is a 16-bit×2K-word memory circuit. In the memory BIST, each memory circuit writes test data at a specified address upon receiving a test vector, and reads test data at a specified address upon receiving a read command. Note that one clock cycle (10 ns) is required for each memory circuit to perform each of a write access for writing data at a specified address and a read access for reading data at a specified address.

Figure 2:
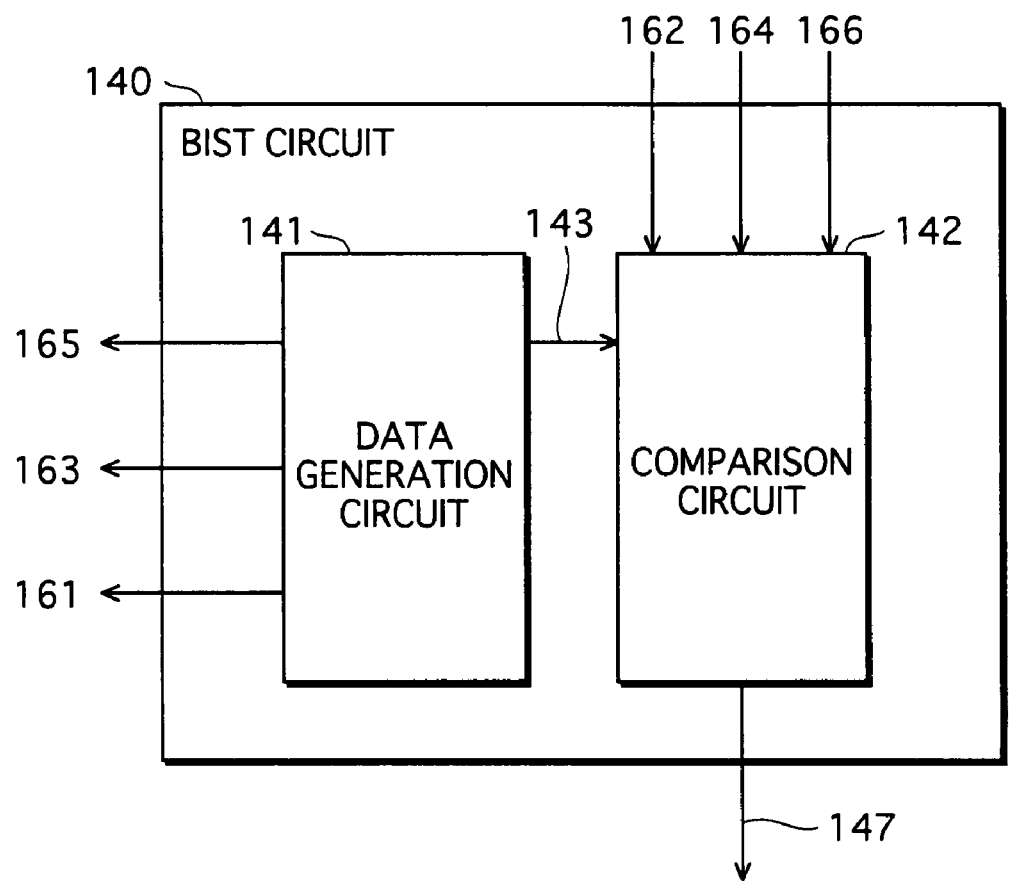
FIG. 2 shows an internal structure of a BIST circuit 140.

The BIST circuit 140 is a circuit block for controlling the BIST. As FIG. 2 shows, the BIST circuit 140 includes a data generation circuit 141 and a comparison circuit 142.

The data generation circuit 141 has a function of alternately outputting a test vector and a read command in each clock cycle in synchronization with the clock signal. Here, the test-vector and the read command used in the memory BIST are generated by the data generation circuit 141. The test vector includes address data specifying a write destination, and a random number as test data to be written in the memory. The read command includes address data specifying a read source. The test vector is output in the following manner specifically: The data generation circuit 141 generates a random number as test data once in two clock cycles, and outputs test data and a control signal including a write address in the memory 110 to a signal wire 163, test data and a control signal including a write address in the memory 120 to a signal wire 161, and test data and a control signal including a write address in the memory 130 to a signal wire 165. Moreover, when outputting the test vector, the data generation circuit 141 outputs the random number used as the test data to the comparison circuit 142 via the signal wire 143 every time.

The comparison circuit 142 has a function of judging the quality of the memory circuit based on read data output by each of the memories 110, 120, and 130.

Specifically, the comparison circuit 142 has a storage area for holding comparison data, output by the data generation circuit 141 once in two clock cycles, for a period of seven clock cycles. Once in two-clock cycles, when receiving the read data of the memory 110, the memory 120 and the memory 130 from the signal wires 164, 162 and 166 respectively, the comparison circuit 142 judges whether the read data and the comparison data received from the data generation circuit 141 seven clock cycles before are the same. If the read data and the comparison data are not the same, this means that the memory circuit has a defect.

Each of the registers 150a-150l is a circuit block realized by a flip-flop circuit that switches an output signal in synchronization with the clock signal. Specifically, each register has a function of continuously outputting the signal that is input when the clock signal switches from the L level to the H level, from an output terminal thereof for a period of one clock cycle.

Figure 3:
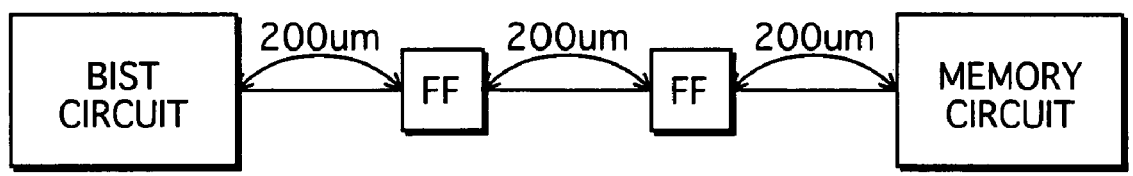
FIG. 3 shows a distance between the BIST circuit and a subject memory.

The test vector as an output signal from the BIST circuit 140 is input to the memories 110, 120 and 130 through the signal wires 161, 163 and 165 via two registers for each. The read data as an output signal from the memories 110, 120 and 130 is input to the BIST circuit 140 through the signal wires 162, 164 and 166 via two registers for each. Here, as FIG. 3 shows, on each signal line connecting the memory circuit and the BIST circuit 140, registers are positioned such that the wire length between each of the circuit blocks is 200 μm.

Accordingly, the interconnect delay that occurs between each circuit block is not more than 10 ns.

Figure 4:
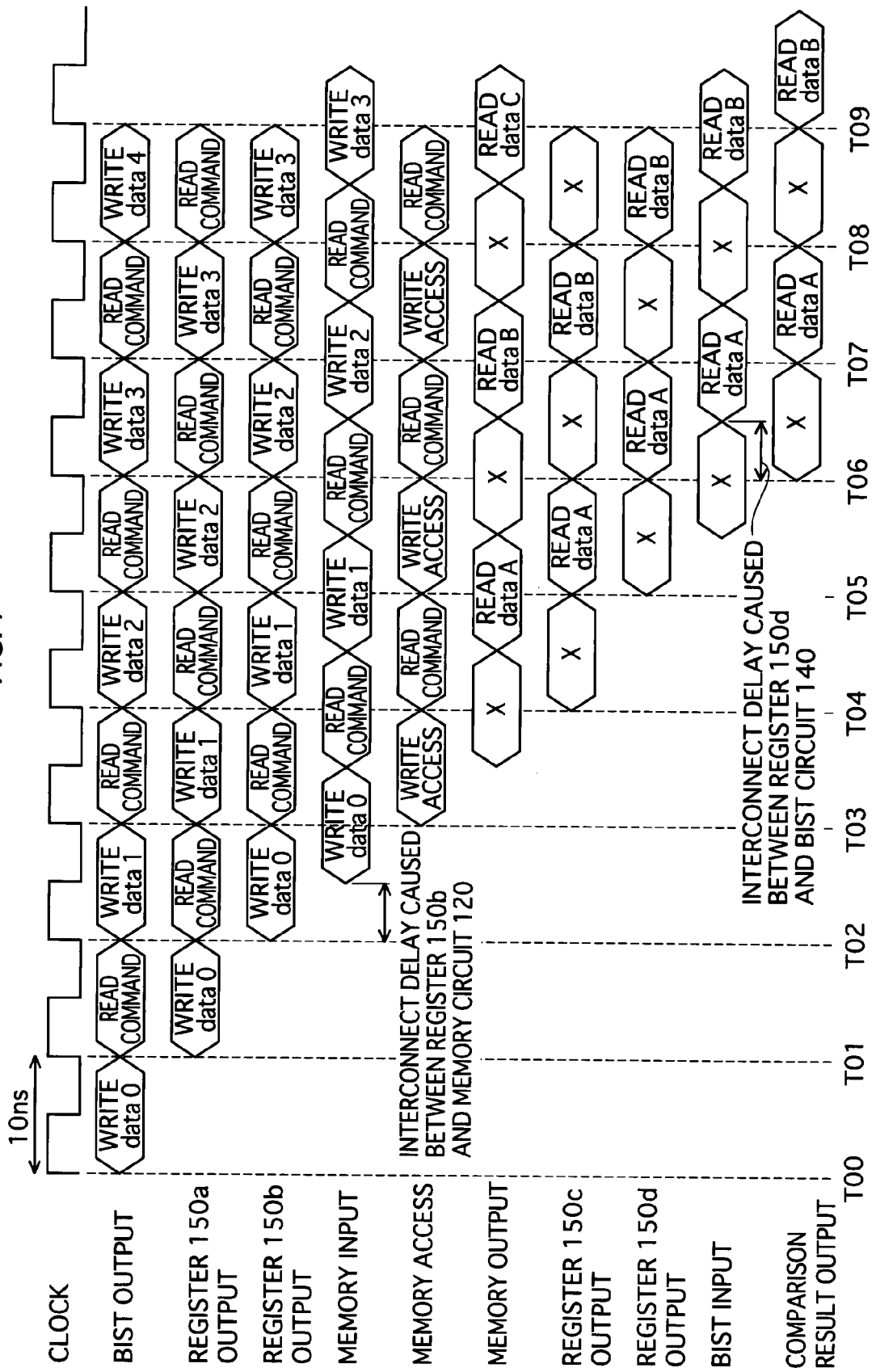
FIG. 4 is a timing chart showing operations of the BIST of the LSI 100 according to the first embodiment.

With the stated circuit structure, as FIG. 4 shows, the test vectors output by the BIST circuit 140 will be output by the registers 150b, 150f and 150j after elapse of a period of two clock cycles. Here, the registers 150b, 150f and 150j immediately precede the memory circuits. In the same manner, the read data read by each of the memory circuits will be output by the registers 150d, 150h and 150l to the BIST circuit 140 after elapse of a period of two clock cycles from the read access performed by the memory circuit. Here, the registers 150d, 150h and 150l immediately precede the BIST circuit 140.

Next, operations for the BIST performed in the LSI 100 that is laid out as described above are explained in detail. In this explanation, the BIST performed on the memory circuit 120 is taken as an example.

Data 0 included in a test vector output by the data generation circuit 141 at time T00 is written at a specified address in the memory circuit 120 by the write access performed at the time T03, which is three clock cycles later than the output of the test vector by the data generation circuit 141. Moreover, in accordance with the read command output by the data generation unit 141 at the time T01 after the test vector including the data 0 is output, the read access is performed in the memory 120, and read data A corresponding to the data 0 as the test data is output by the memory circuit 120.

The read data A read from the memory 120 is transferred by the registers 150c and 150d at the times T05 and T06 respectively. As a result, the read data A is input in the comparison circuit 142 from the signal wire 162 when a period for two clock cycles and a period of the interconnect delay that occurs between the register 150d and the BIST circuit 140 elapse after the read access is performed by the memory circuit 120 at the time T04.

As described above, the required time between when the test vector including the data 0 output by the data generation circuit 141 and when the read data A corresponding to the data 0 is input in the comparison circuit 142 is the total of 6 clock cycles between the time T00-T06 and the time of the interconnect delay that occurs between the register 150d and the BIST circuit 140.

As a result, seven clock cycles after the test vector including the data 0 is output, the comparison circuit 142 outputs the comparison result, indicating whether the read data A and the comparison data is the same or not, to outside the LSI 100. Here, the comparison data is received from the data generation circuit 141 when the data 0 is output.

With these operations, the LSI 100 requires seven clock cycles from the output of the test vector, to judge the quality of one memory block on the memory circuit. However, since the signal line connecting the BIST circuit 140 and the memory circuit is realized as a pipeline using the registers, the write access and the read access are alternately repeated in the memory circuit in each clock cycle as FIG. 4 shows. Accordingly, in the LSI 100 according to the present invention, it is apparently possible to judge the quality of one memory block in each two-clock cycles, which is equivalent to 20 ns.

Next, a layout design tool used for designing the layout of the semiconductor integrated circuit according to the present invention.

General layout design tools have an automatic allocating/wiring function for allocating macro cells and wiring the allocated macro cells together based on a net list. The macro cells are circuit blocks realizing hardware/software functions required for structuring the LSI. The layout design tool according to the present invention has a BIST circuit insertion function for additionally allocating the BIST circuit for a memory among the allocated macro cells, and wiring the BIST circuit and the memory together.

The following describes the functional structure for realizing the BIST circuit insertion function of the layout design tool.

Figure 5:
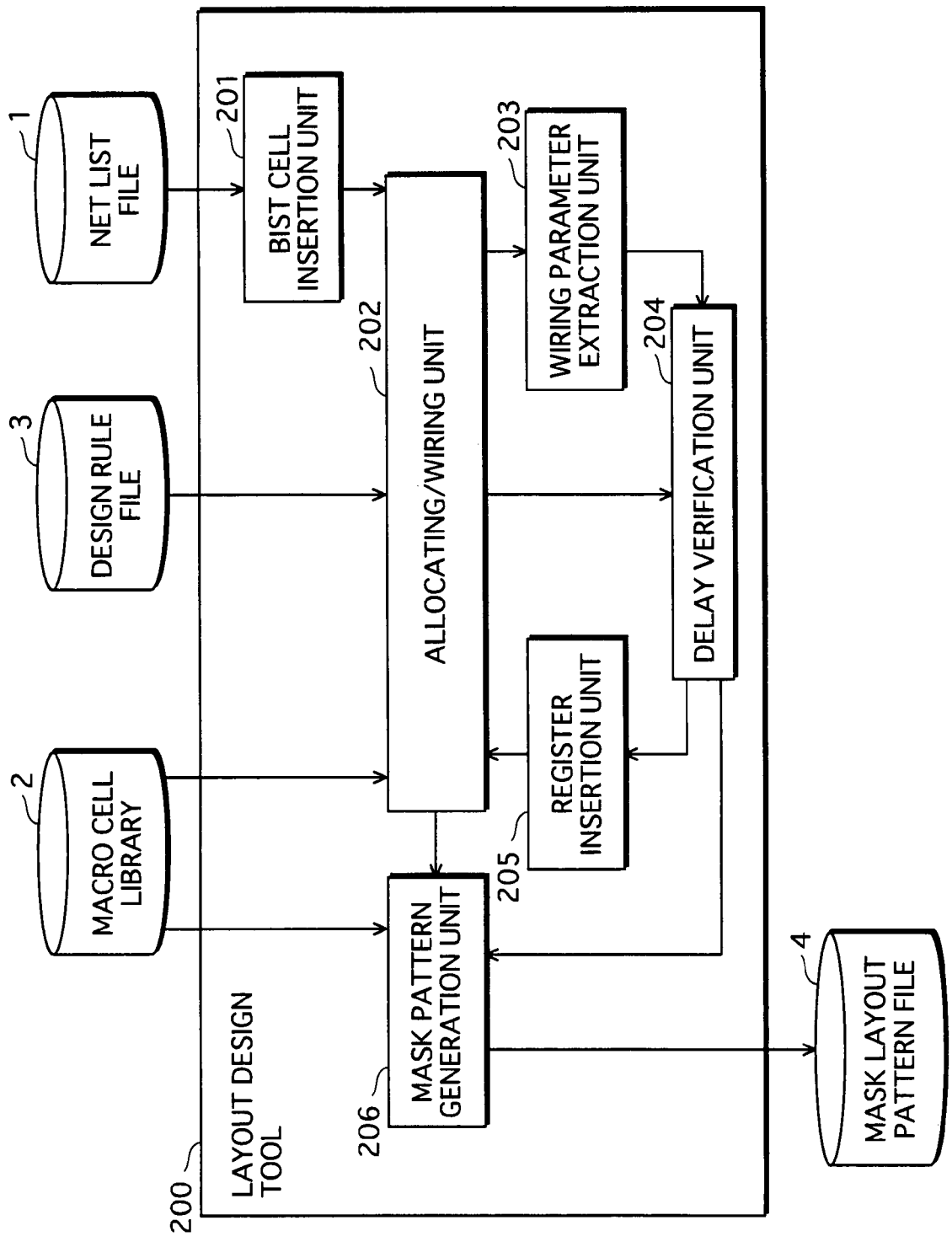
FIG. 5 is shows a functional structure of a layout design tool 200 according to the first embodiment.

FIG. 5 shows the functional structure of a layout design tool 200. The layout design tool 200 includes functional blocks, namely a BIST cell insertion unit 201, an allocating/wiring unit 202, a wiring parameter extraction unit 203, a delay verification unit 204, a register insertion unit 205, and a mask pattern generation unit 206.

The BIST cell insertion unit 201 reads a net list file 1 that defines the net list, and adds a BIST cell in the net list so as to connect the BIST cell to each memory in the net list.

The allocating/wiring unit 202 is a functional block that reads mask patterns for macro cells from a macro cell library 2, determines locations of the macro cells on the semiconductor chip based on the net list, and lays out wirings so as to connect the macro cells whose locations are determined together, based on the net list.

Here, if the net list is defined such that a flip-flop circuit intervenes between the memory circuit and the BIST cell, the allocating/wiring unit 202 temporarily lays out the wiring directly connecting the memory circuit and the BIST cell, and allocates the flip-flop circuit at such a location that the interconnect delay on the temporary wiring is evenly distributed to each of the memory circuit, the BIST cell and the flip-flop circuit. In the same manner as general layout design tools, the allocating/wiring unit 202 determines the locations of the macro cells and the wiring layout so as to satisfy a design rule defined in a design rule file 3. The design rule file 3 defines widths of wirings, the distance between wirings and so on.

The wiring parameter extraction unit 203 extracts parasitic parameters, such as the resistance and the capacity of the wiring that connects the memory and the BIST cell, among the wirings determined by the allocating/wiring unit 202.

The delay verification unit 204 analyzes the interconnect delay that occurs on the wiring between the memory circuit and the BIST cell, based on the parasitic parameters extracted by the wiring parameter extraction unit 203, and compares the interconnect delay and the access speed of the memory circuit. Here, if one or more flip-flop circuits are inserted between the memory and the BIST cell, the maximum interconnect delay among delays that occur between any of the memory circuit, the BIST cell and the flip-flop circuits is used for the comparison. As a result of the comparisons if there is any signal line whose interconnect delay is larger than the access speed of the memory circuit, the delay verification unit 204 instructs the register insertion unit 205 to insert a flip-flop circuit. If there is no signal line whose interconnect delay is larger than the access speed of the memory circuit, the delay verification unit 204 instructs the mask pattern generation unit 206 to generate a mask pattern.

The register insertion unit 205 updates, in accordance with the instruction given by the delay verification unit 204, the net list to add a flip-flop circuit to the wiring whose interconnect delay is judged as being larger than the access speed of the memory circuit. Then, based on the updated net list, the register insertion unit 205 instructs the allocating/wiring unit 202 to lay out the semiconductor chip again.

The mask pattern generation unit 206 generates and outputs, using the mask patterns for each macro cell stored in the macro cell library 2, a mask layout pattern file 4 for a layout determined by the allocating/wiring unit 202. The mask layout pattern file 4 generated here is IC layout data showing the layout of the semiconductor chip, and is a GDSII format stream file.

Figure 6:
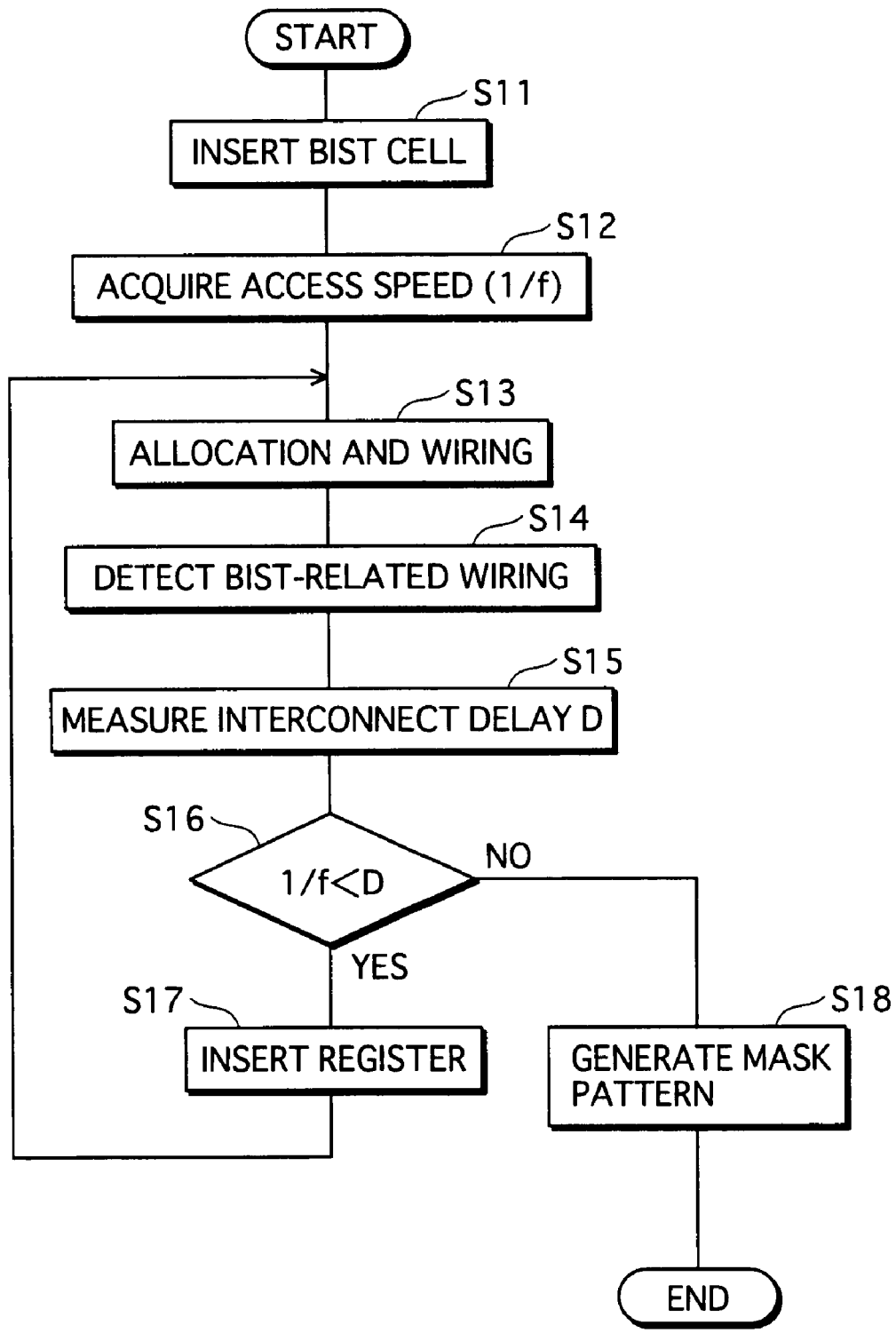
FIG. 6 is a flowchart showing a flow of operations of the layout design tool 200 according to the first embodiment.

The following describes a flow of operations of the layout design tool 200 for inserting the BIST circuit. FIG. 6 is a flowchart showing the operations of the layout design tool 200.

Firstly, the BIST cell insertion unit 201 reads the net list file 1, and adds the BIST cell to the net list (Step S11). The delay verification unit 204 acquires the access speed of each memory circuit (Step S12). The allocating/wiring unit 202 lays out the semiconductor chip based on the net list to which the BIST cell is added (Step S13). The wiring parameter extraction unit 203 detects, from the layout, the wiring connecting each memory and the BIST cell (Step S14), and measures an interconnect delay D based on the parasitic parameters such as the resistance and the capacity of the detected wiring (Step S15). The delay verification unit 204 acquires the interconnect delay D from the wiring parameter extraction unit 203, and verifies whether the interconnect delay D is larger than the access speed (Step S16) If the interconnect delay D is larger than the access speed (Step S16: YES), the delay verification unit 204 instructs the register insertion unit 205 to insert the flip-flop circuit. The register insertion unit 205 updates the net list, and instructs the allocating/wiring unit 202 to lay out the semiconductor chip again based on the updated net list (Step S17). If the interconnect delay D is not larger than the access speed (Step S16: NO), the mask pattern generation unit 205 generates a mask pattern (Step S18).

As described above, according to the first embodiment of the present invention, it is possible to improve the test speed of the BIST by allocating the register circuits on the wiring between the BIST circuit and each memory circuit to realize the BIST processing as a pipeline, even if the distance between the BIST circuit and each memory circuit is large because the BIST circuit is shared by the plurality of the memory circuits.

In particular, the first embodiment realizes an at-speed test of the memory circuits by determining the number of the register circuits and allocating the register circuits such that the interconnect delay that occurs on the wirings between the BIST circuit and each of the memory circuits is not larger than the access speed of each memory circuit.

Second Embodiment

The second embodiment explains a structure that further reduces the circuit area relating to the BIST.

Figure 7:
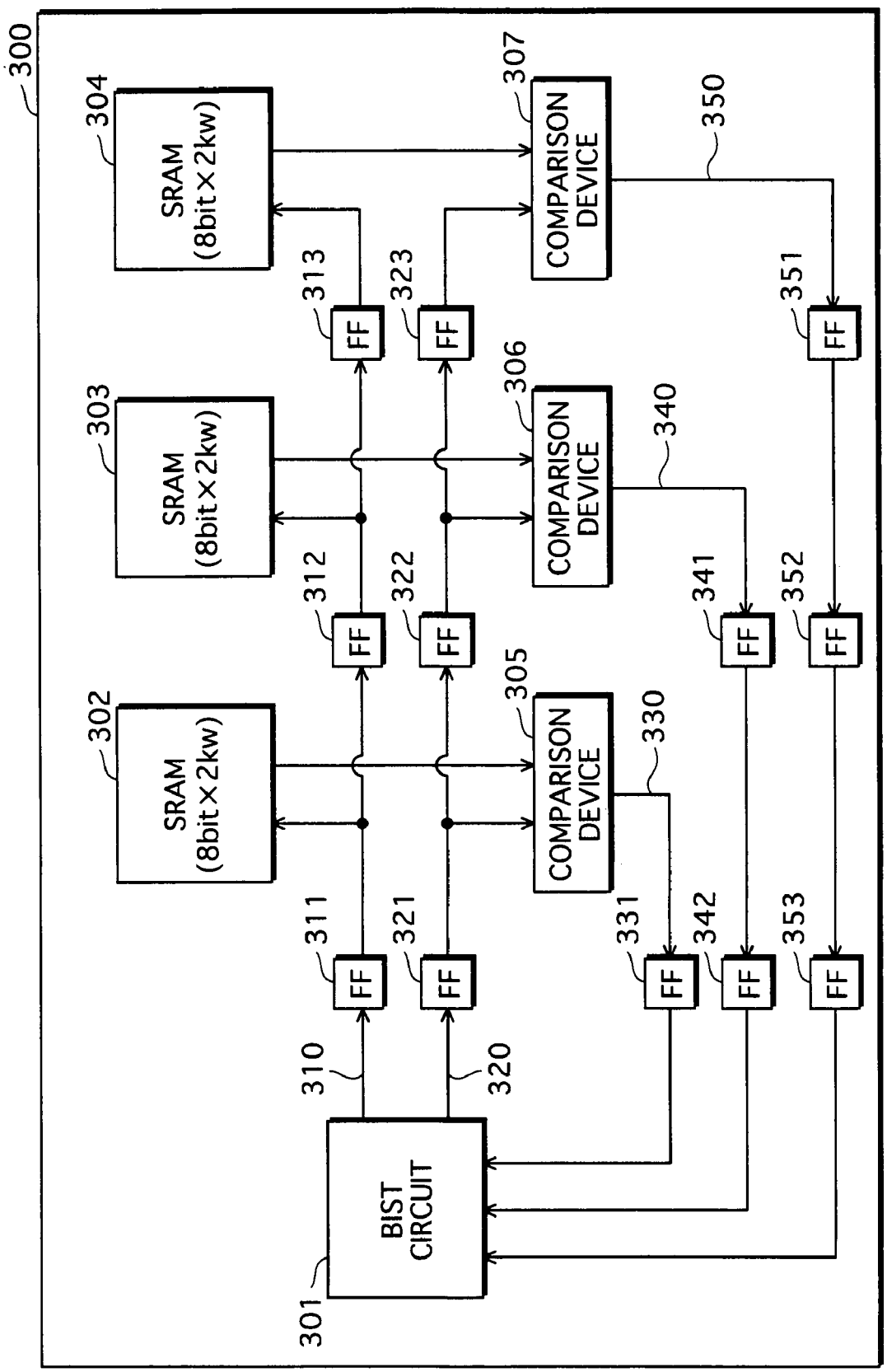
FIG. 7 shows a structure relating a BIST of an LSI 300 according to the second embodiment.

FIG. 7 shows a structure relating to the BIST in an LSI 300 according to the second embodiment.

The LSI 300 includes, in addition to a BIST circuit 301 and memories 302, 303 and 304 as targets of the BIST, circuit blocks that are not illustrated, such as a microcomputer, dedicated hardware, and a programmable logic circuit.

The memories 302, 303 and 304 are memory circuits that are the same as the memories 101, 102 and 103 shown in FIG. 1, and are targets of the BIST test. Each memory circuit outputs a read data to a comparison device corresponding to the memory circuit.

In the same manner as the data generation unit 141, the BIST circuit 301 has functions of generating and outputting a test vector and a read command, outputting a random number as a comparison data, which has been used as test data in the test vector, and acquiring the comparison results output by comparison devices 305, 306 and 307 and outputting the comparison results to outside the LSI 300.

The comparison devices 305, 306 and 307 respectively correspond to the memory 302, 303 and 304. Upon receiving the read data of the corresponding memory circuit and the comparison data, each comparison device judges whether they are identical or not, and outputs a comparison result.

Each register illustrated as "FF" in the drawing has the same structure as the register 150 in FIG. 1. Each register is positioned such that the interconnect delay that occurs between the register and the adjoining circuit block is not more than 10 ns, which is the access speed of the memory circuit.

Among these registers, the registers 311, 312 and 313 connected in series to a signal wire 310, to which the BIST circuit 301 outputs the test vectors and the read commands, form a shift register. In other words, each of the registers 311, 312 and 313 transfers the test vectors and the read commands that are sequentially input to the register 311 from the BIST circuit 301 via the signal wire 310 to the next register in each clock cycle, and at the same time, outputs the test vectors and the read commands to the memory circuit corresponding to each register. Specifically, the signal wire 310 to which the BIST circuit 301 outputs the test vector and the read command is connected to the input of the register 311. The output of the register 311 is connected to the inputs of the memory 302 and the register 312. The output of the register 312 is connected to the inputs of the memory 303 and the register 313. The output of the register 313 is connected to the input of the memory 304. By connecting the registers and the memory circuits in this manner, part of wirings for providing each of the plurality of the memory circuits with the test vectors and the read commands can be shared. As a result, the area of the wirings and the number of registers to be allocated on the wirings can reduced compared to the first embodiment.

In the same manner as the registers 311, 312 and 313, among the register illustrated in the drawing, the registers 321, 322 and 323 connected in series to a signal wire 320, to which the BIST circuit 301 outputs the comparison data, form a shift register. In other words, each of the registers 321, 322 and 323 transfers the pieces of comparison data that are sequentially input to the register 321 from the BIST circuit 301 via the signal wire 320 to the next register in each clock cycle, and at the same time, outputs the comparison data to the comparison device corresponding to each register. Specifically, the signal wire 320 to which the BIST circuit 301 outputs the comparison data is connected to the input of the register 321. The output of the register 321 is connected to the input of the register 322 and the input of a comparison device 305 which receives the read data of a memory 502. The output of the register 322 is connected to the input of the register 323 and the input of a comparison device 306 which receives the read data of a memory 503. The output of the register 323 is connected to the input of a comparison device 306 which receives the read data of a memory 504.

Moreover, on each of a signal wire 330 to which the comparison device 305 outputs the comparison result, a signal wire 340 to which the comparison device 306 outputs the comparison result and a signal wire 350 to which the comparison device 307 outputs the comparison result, registers whose number is in correspondence with the distance between the corresponding comparison device and the BIST circuit, such that the interconnect delay that occurs between the circuit blocks on each signal wire is not more than 10 ns. Specifically, a register 331 is connected to the signal wire 330, and the comparison result is sequentially transferred from the comparison device 305 to the register 331 and from register 331 to the BIST circuit 301 in each clock cycle. Registers 341 and 342 are connected to, the signal wire 340 in series, and the comparison result is sequentially transferred from the comparison device 306 to the register 341, from the register 341 to the register 342 and from the register 342 to the BIST circuit 301 in each clock cycle. Registers 351, 352 and 353 are connected to the signal wire 350, and the comparison result is sequentially transferred from the comparison device 307 to the register 351, from the register 351 to the register 352, from the register 352 to the register 353 and from the register 353 to the BIST circuit 301 in each clock cycle.

As described above, according to the second embodiment, part of each wiring that transmits the test vector is shared by the plurality of memory circuits, and part of each wiring that transmits the comparison data is shared by the plurality of comparison devices. As a result, the number of registers located in the wiring area and on each wiring can be reduced, and this is effective for reducing the circuit area relating to the BIST.

In particular, the effect of reducing the area over head becomes more considerable as the number of the memory circuits as the targets of the test increases.

Note that in the above-described structure, the components for performing the BIST include components that are not necessary after the semiconductor product is shipped. Therefore, it is possible to realize the structure by reconfiguring the programmable logic circuit.

Figure 8:
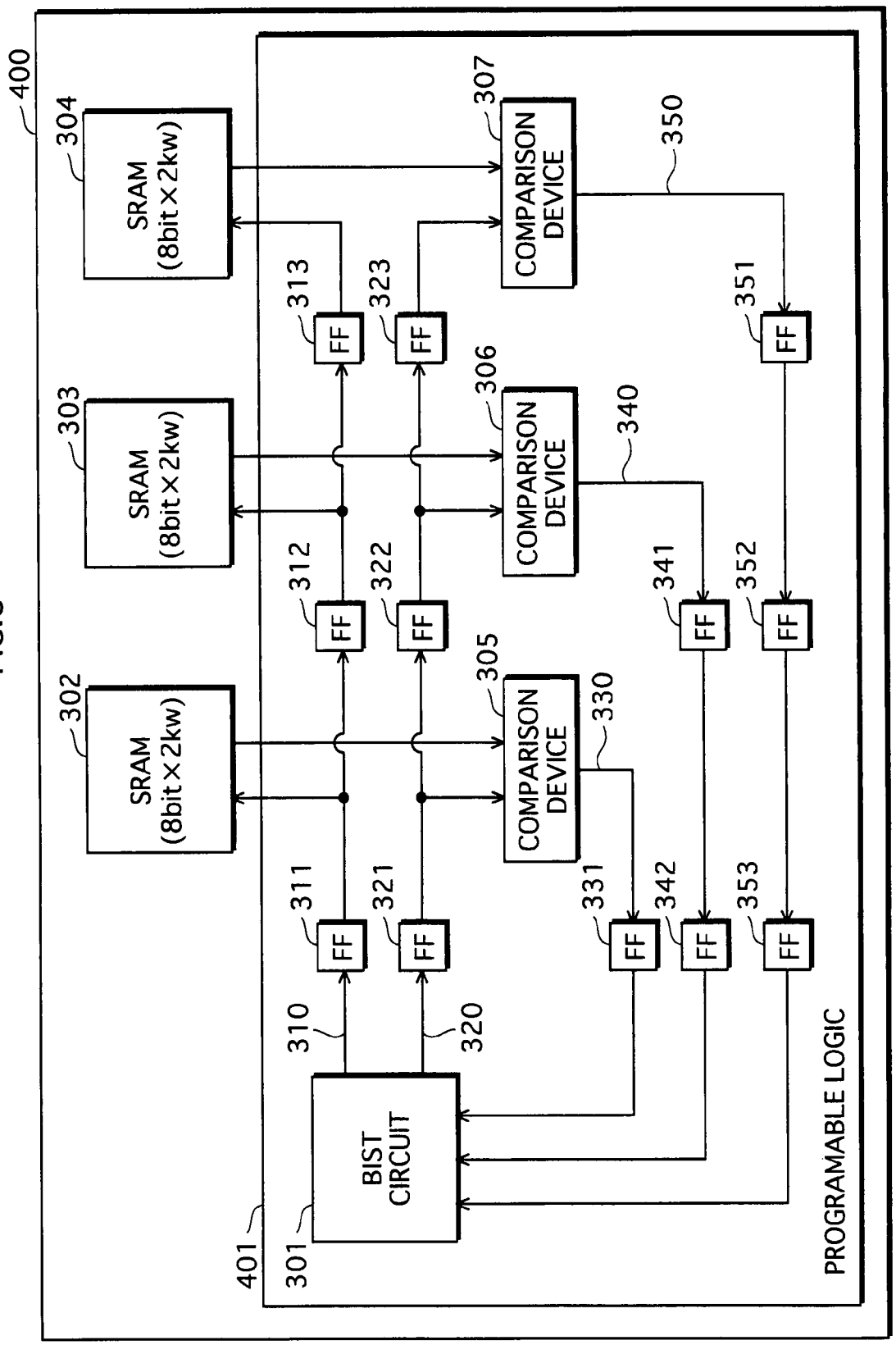
FIG. 8 schematically shows a structure of an LSI 400 according to a modification example of the second embodiment.

FIG. 8 schematically shows a modification example of a structure of elements relating to the BIST realized by configuring the programmable logic. In an LSI 400, the BIST circuit, the registers, the comparison devices and the connections therebetween are realized by a programmable logic circuit 401 included in the LSI 400. Such a modification example is applicable to an LSI in which a programmable logic circuit is laid out so as to adjoin a plurality of memory circuits.

With this modification, it is possible to perform a memory test at high speed by reconfiguring the programmable logic circuit included in the LSI so as to have a structure required for the BIST. In addition, it is possible to further miniaturize the LSI, because it is unnecessary to implement circuits dedicated to the BIST in the LSI.

Third Embodiment

Figure 9:
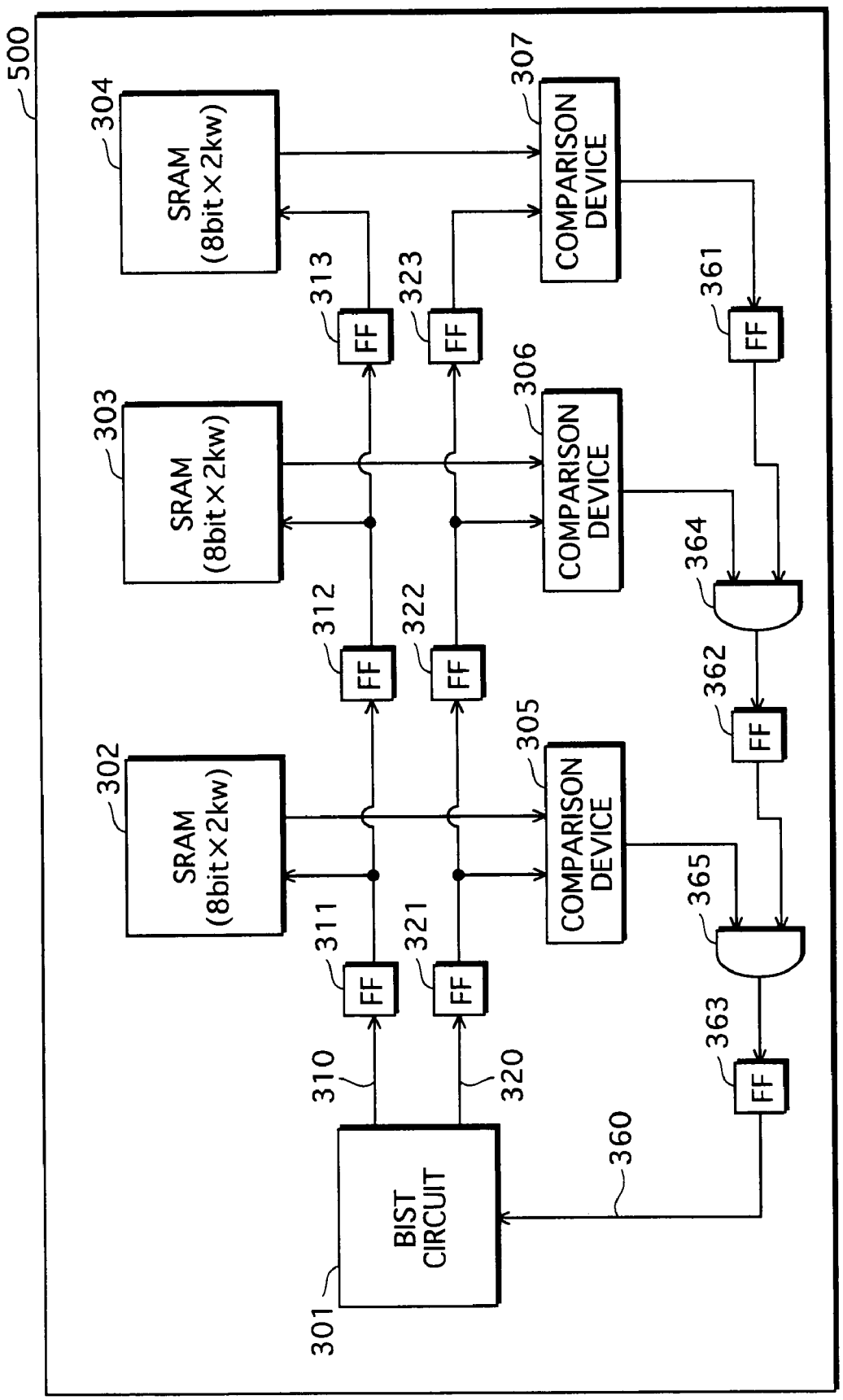
FIG. 9 shows a structure relating to a BIST of an LSI 500 according to the third embodiment.

FIG. 9 shows a structure relating to the BIST in an LSI 500 according to the third embodiment.

The difference from the LSI 300 shown in FIG. 7 is that the outputs from the comparison devices 305, 306 and 307 in the LSI 500 are connected together as a serial chain.

As described above, upon receiving the read data of the corresponding memory circuit and the comparison data, each of the comparison devices 305, 306 and 307 compares whether the read data and the comparison data are identical, and outputs the comparison result. Specifically, if the pieces of data are identical, the comparison device outputs "1", and if not, the comparison device outputs "0".

The output from the comparison device 307 is input to a register 361, and the output from the register 361 is input to a logic circuit 365. The output from the comparison device 306 is also input to the logic circuit 364. The logic circuit 364 outputs logical multiplication of the input value. Accordingly, the logic circuit 364 outputs "1" only when the read data and the comparison data are identical in both the comparison devices 306 and 307. In the other cases, the logic circuit 364 outputs "0".

The logical multiplication output from the logic circuit 364 is input to a register 362, and the output from the register 362 is input to the logic circuit 365. The output from the comparison device 305 is also input to the logic circuit 365. The logic circuit 365 outputs logical multiplication of the outputs from the register 362 and the comparison device 305. Accordingly, the logic circuit 365 outputs "1" only when the read data and the comparison data are identical in all the comparison devices 305, 306 and 307. In the other cases, the logic circuit 364 outputs "0".

The logical multiplication output from the logic circuit 365 is input to the BIST circuit 301 via a register 363. As a result, the BIST circuit receives "0" from the register 363 if any of the comparison devices 305, 306 and 307 outputs "0", and this shows that any of the memory circuits has a defect.

As described above, part of wiring that transferring the comparison result between the read data and the comparison data of each memory circuit to the BIST circuit is shared by the plurality of comparison devices. As a result, the number of registers located in the wiring area and on each wiring can be reduced, and this is effective for reducing the circuit area relating to the BIST.

Note that it is possible to further miniaturize the LSI by realizing the components for performing the BIST by reconfiguring a programmable logic.

Figure 10:
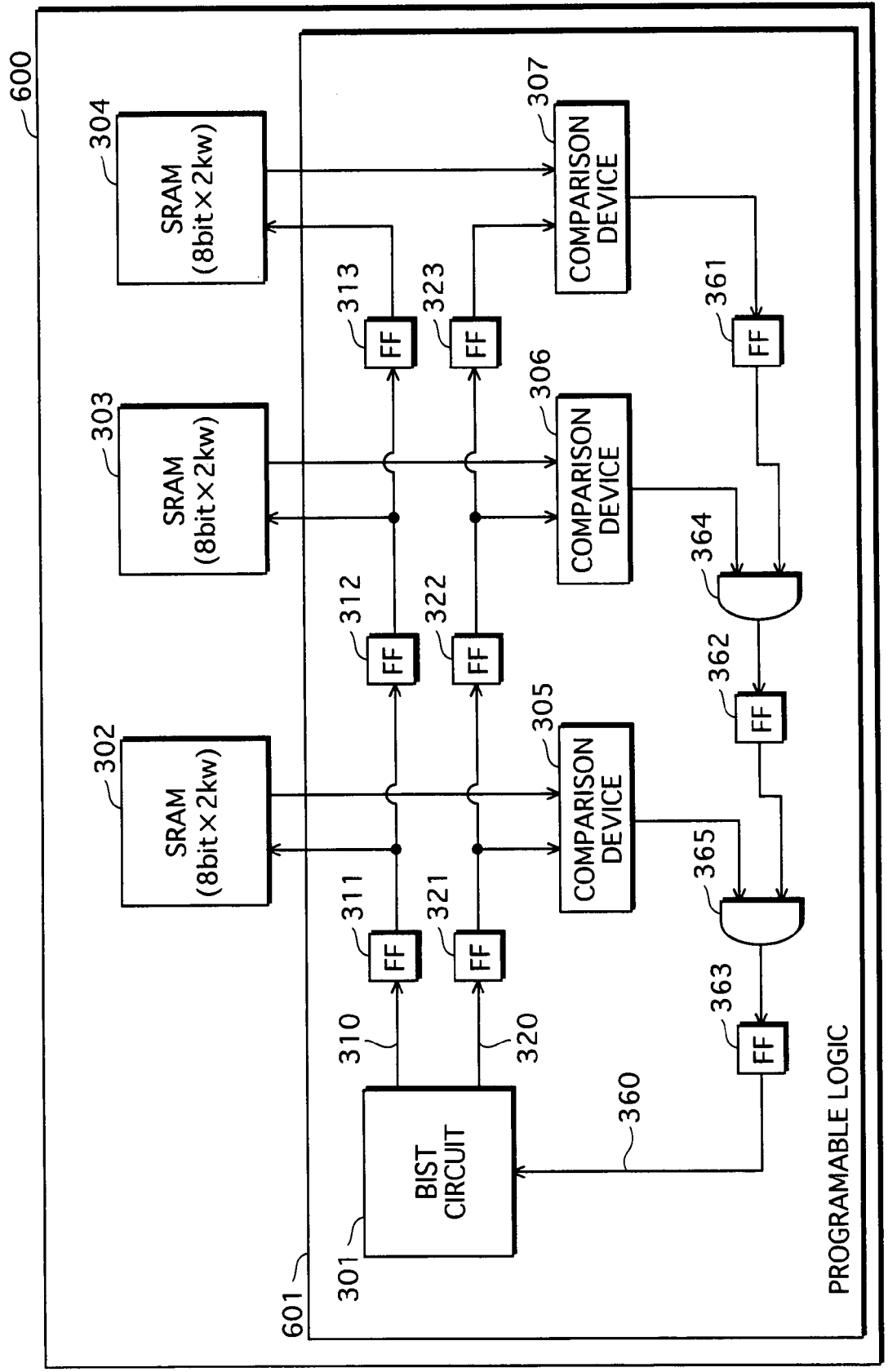
FIG. 10 schematically shows a structure of an LSI 600 according to a modification example of the third embodiment.

FIG. 10 schematically shows a modification example of a structure of elements relating to the BIST realized by configuring a programmable logic.

In an LSI 600, the BIST circuit, the registers, the comparison devices and the connections therebetween are realized by reconfiguring a programmable logic circuit 601 included in the LSI 600. Such a modification example is applicable to an LSI in which a programmable logic circuit is laid out so as to adjoin a plurality of memory circuits.

Note that although the present invention is explained above based on the embodiments, the present invention is not limited to the embodiments. The followings are also included in the present invention.

(1) The first embodiment shows a structure in which two registers are inserted between the BIST circuit and each memory circuit. However, the number of the registers 150 may be any.

(2) The embodiments above show a structure in which the qualities of three memory circuits are tested. However, the number of memory circuits as the test targets may be any number that is equal to or more than two.

(3) The design tool shown in the embodiments above determines the number of registers to be inserted based on the comparison result between the access speed of the memory circuit and the interconnect delay. However, the number may be determined based on the distance between the BIST circuit and the memory. Here, the distance may be the wiring length between the BIST circuit and the memory, or distance in a straight line.

(4) The embodiments and modification examples above may be combined together.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:
1. A semiconductor integrated circuit comprising:
a testing circuit operable to sequentially output test vectors in accordance with clock signals;
a plurality of memory circuits;
one or more register circuits each allocated on a signal line connecting the testing circuit with any of the memory circuits, and operable to receive test vectors output by the testing circuit, and transfer the received test vectors in accordance with the clock signals;

a comparison shift register including a plurality of register circuits and operable to output in parallel a plurality of pieces of comparison data input in series; and a plurality of comparison circuits respectively corresponding to the memory circuits, each operable to compare read data with comparison data, the read data having been read by corresponding one of the memory circuits in accordance with the test vectors, and the comparison data having been output from any of the register circuits that constitute the comparison shift register, wherein the testing circuit sequentially outputs pieces of comparison data respectively corresponding to the test vectors to the comparison shift register in accordance with the clock signals, an interconnect delay that occurs between any adjoining two of the test circuit, the memory circuits and the one or more register circuits is equal to or shorter than an access time required for each of the memory circuits to write and read data, the register circuits are allocated on the signal line in series, thereby constituting a shift register, the shift register outputs in parallel the test vectors input in series, and each memory circuit receives the test vectors from any of the register circuits that constitute the shift register.

2. The semiconductor integrated circuit of claim 1, further comprising:

another one or more register circuits each allocated on a signal line connecting the testing circuit with any of the comparison circuits, and operable to receive a comparison result from an adjoining macro cell in accordance with the clock signals.

3. A semiconductor integrated circuit comprising:

a testing circuit operable to sequentially output test vectors and pieces of comparison data respectively corresponding to the test vectors in accordance with clock signals;

a plurality of memory circuits;

a plurality of comparison circuits respectively corresponding to the memory circuits, each operable to compare read data with comparison data, the read data having been read by corresponding one of the memory circuits in accordance with the test vectors, one or more first register circuits each allocated on a signal line connecting the testing circuit with any of the memory circuits, and operable to receive test vectors output by the testing circuit, and transfer the received test vectors in accordance with the clock signals; and one or more second register circuits each allocated on a signal line connecting the testing circuit with any of the comparison circuits, and operable to receive comparison data output by the testing circuit, and transfer the received comparison data in accordance with the clock signals;

wherein the number of the first register circuits and the number of the second register circuits are the same.

4. A method for designing a BIST circuit, comprising the steps of:

calculating a first interconnect delay time that occurs between macro cells allocated on a signal line from a testing circuit to a memory circuit, the testing circuit sequentially outputting test vectors in accordance with clock signals;

calculating a second interconnect delay time that occurs between macro cells allocated on a signal line from a memory circuit to a comparison circuit, the comparison circuit sequentially receiving read data from the memory circuit in accordance with clock signals;

judging whether either the first interconnect delay time or the second interconnect delay time is longer than a testing time required for the memory circuit to write and read data indicated by each test vector;

if the interconnect delay time is longer than the testing time, changing a design of the BIST circuit so as to add, on the signal line, one or more first register circuits that transfer the test vectors in accordance with the clock signals and one or more second register circuits that transfer read data in accordance with the clock signals, wherein the number of the first register circuits and the number of the second register circuits are the same.

* * * * *